United States Patent
Kwak

(10) Patent No.: US 7,432,888 B2
(45) Date of Patent: Oct. 7, 2008

(54) LIGHT EMITTING PANEL AND LIGHT EMITTING DISPLAY

(75) Inventor: Won-Kyu Kwak, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 583 days.

(21) Appl. No.: 11/069,694

(22) Filed: Mar. 1, 2005

(65) Prior Publication Data

US 2005/0243035 A1    Nov. 3, 2005

(30) Foreign Application Priority Data

Apr. 29, 2004 (KR) ............... 10-2004-0029920

(51) Int. Cl.
 *G09G 3/30* (2006.01)
(52) U.S. Cl. .................. 345/76; 345/82; 315/169.3
(58) Field of Classification Search .............. 345/76, 345/82; 315/169.3
See application file for complete search history.

(56) References Cited

U.S. PATENT DOCUMENTS

| | | | | |
|---|---|---|---|---|
| 6,580,408 B1 * | 6/2003 | Bae et al. | | 345/76 |
| 6,809,482 B2 * | 10/2004 | Koyama | | 315/169.3 |
| 7,057,589 B2 * | 6/2006 | Shin et al. | | 345/82 |
| 7,277,071 B2 * | 10/2007 | Oh | | 345/76 |
| 2002/0047581 A1 * | 4/2002 | Koyama | | 315/169.3 |
| 2002/0118150 A1 * | 8/2002 | Kwon | | 345/76 |
| 2003/0179164 A1 * | 9/2003 | Shin et al. | | 345/76 |
| 2004/0046719 A1 * | 3/2004 | Wang et al. | | 345/82 |
| 2005/0093788 A1 * | 5/2005 | Shin | | 345/76 |

* cited by examiner

*Primary Examiner*—Bipin Shalwala
*Assistant Examiner*—Afroza Y Chowdhury
(74) *Attorney, Agent, or Firm*—Christie, Parker & Hale, LLP

(57) ABSTRACT

A display device including a plurality of scan lines provided in a first direction for transmitting select signals, a plurality of data lines provided in a second direction for transmitting data signals, and a plurality of pixel circuits respectively coupled to the scan lines and the data lines. At least one of the pixel circuits includes at least two emit elements, and a capacitor for charging voltages corresponding to data signals is provided in an area between the emit elements. The emit elements have a rectangular shape, and have short sides in the first direction and long sides in the second direction. The capacitor is disposed between the long sides of the emit elements.

17 Claims, 5 Drawing Sheets

LIGHT EMITTING PANEL AND LIGHT EMITTING DISPLAY

CROSS REFERENCE TO RELATED APPLICATION

This application claims priority to and the benefit of Korean Patent Application No. 10-2004-0029920, filed on Apr. 29, 2004 in the Korean Intellectual Property Office, the entire content of which is incorporated herein by reference.

BACKGROUND OF THE INVENTION

1. Field of the Invention

The present invention relates to a display device, and more particularly, to an organic electroluminescent (EL) display using electroluminescence of an organic matter.

2. Discussion of the Related Art

In general, an organic EL display is a displaying device for electrically exciting phosphorous organic compounds to emit light. The organic EL display drives n×m organic light emitting elements arranged in a matrix format to represent images.

The organic light emitting elements have diode characteristics so they may be referred to as organic light emitting diodes (OLEDs), and have a structure including an anode electrode layer (ITO), an organic thin-film layer, and a cathode electrode layer (metallic). The organic thin film has a multi-layered structure including an emitting layer (EML), an electron transport layer (ETL), and a hole transport layer (HTL) to balance electrons and holes and improve light emission efficiency, and it additionally has an electron injecting layer (EIL) and a hole injecting layer (HIL). The organic light emitting elements form an organic EL display panel through an arrangement in an n×m matrix format.

Methods for driving the organic EL display panel include a passive matrix method and an active matrix method which uses thin-film transistors (TFTs). The passive matrix method forms anodes and cathodes to cross (or cross over) with or to be substantially perpendicular to each other, and selects lines to drive organic EL elements. The active matrix method sequentially turns on a plurality of TFTs coupled to data lines and scan lines according to scan select signals to thus drive organic EL elements.

A pixel circuit of a general active matrix organic EL display will be described.

FIG. 1 shows one of n×m pixels, that is, equivalently illustrating a pixel provided on the first row and the first column.

As shown in FIG. 1, a pixel 10 has three sub-pixels 10r, 10g, and 10b which have organic EL elements OLEDr, OLEDg, and OLEDb respectively emitting red, green, and blue (RGB) lights. In the case of sub-pixels arranged in a stripe pattern, the sub-pixels 10r, 10g, and 10b are coupled to data lines D1r, D1g, and D1b, and a common scan line S1.

The red sub-pixel 10r includes transistors M11r and M12r and a capacitor C1r for driving the organic EL element OLEDr. Likewise, the green sub-pixel 10g includes transistors M11g and M12g and a capacitor C1g, and the blue sub-pixel 10b includes transistors M11b and M12b and a capacitor C1b. The connection and operation of only the sub-pixel 10r will now be described since the connections and operations of the sub-pixels 10r, 10g, and 10b are substantially the same.

The driving transistor M11r is coupled between a power supply voltage of VDD and an anode of the organic EL element OLEDr to transmit a light emitting current to the organic EL element OLEDr, and a cathode of the organic EL element OLEDr is coupled to a voltage of VSS which is lower than the power supply voltage of VDD. The current of the driving transistor M11r is controlled by a data voltage applied through the transistor M12r. In this instance, the capacitor C1r is coupled between a source and a gate of the transistor M11r to maintain the applied voltage for a predetermined time. A gate of the transistor M12r is coupled to the scan line S1 for transmitting an on/off-type select signal, and a source of the transistor M12r is coupled to the data line D1r for transmitting a data voltage corresponding to the red sub-pixel 10r.

In operation, when the switching transistor M12r is turned on in response to a select signal applied to the gate, a data voltage of VDATA provided by the data line D1r is applied to the gate of the transistor M11r. A current ($I_{OLED}$) flows to (and/or through) the transistor M11r in correspondence to a voltage charged between the gate and the source by the capacitor C1r, and the organic EL element OLEDr emits light in correspondence to the current ($I_{OLED}$). In this instance, the current ($I_{OLED}$) flowing to the organic EL element OLEDr is given in Equation 1.

$$I_{OLED} = \frac{\beta}{2}(V_{GS} - V_{TH})^2 \qquad \text{Equation 1}$$
$$= \frac{\beta}{2}(V_{DD} - V_{DATA} - |V_{TH}|)^2$$

where $V_{TH}$ is a threshold value of the transistor M11r, and $\beta$ is a constant.

As represented by Equation 1, in the pixel circuit shown in FIG. 1, a current corresponding to the data voltage is supplied to the organic EL element OLEDr, and the organic EL element OLEDr emits light with the brightness corresponding to the supplied current. In this instance, the applied data voltage has plural values within a predetermined range in order to represent gray scales.

As described, the organic EL display allows one pixel 10 to have three sub-pixels 10r, 10g, and 10b, each of which includes a driving transistor, M11r, M11g or M11b, a switching transistor, M12r, M12g or M12b, and a capacitor, C1r, C1g or C1b, for driving an organic EL element. Also, a data line, D1r, D1g or D1b, for transmitting data signals and a power line for transmitting the power supply voltage of VDD are provided for each sub-pixel.

Therefore, the number of transistors, capacitors, and wires for transmitting voltages and signals is increased so that it is difficult to lay out all of them in the pixels, and aperture ratios corresponding to light-emitting areas in the pixels are decreased (i.e., a ratio between the bright pixel area and the pixel area that is blocked by the parts to drive each pixel is decreased.).

SUMMARY OF THE INVENTION

An aspect of the present invention provides a light emitting display having an efficient arrangement of structures corresponding to pixel areas.

In one exemplary embodiment of the present invention, a display device includes a plurality of scan lines provided in a first direction for transmitting select signals, a plurality of data lines provided in a second direction for transmitting data signals, and a plurality of pixel circuits respectively coupled to the scan lines and the data lines. At least one of the pixel circuits includes a capacitor, a first transistor, a first emit element and a second emit element, and a first emit control transistor and a second emit control transistor. The capacitor charges a voltage corresponding to one of the data signals transmitted by a corresponding one of the data lines, the first transistor outputs a current corresponding to the voltage charged in the capacitor, the first and second emit elements output light corresponding to the current output by the first transistor, the first and second emit control transistors selectively apply the current output by the first transistor to the first and second emit elements, and the capacitor is disposed in an area between the first and second emit elements. The scan lines and the data lines may insulatively cross over each other.

The first direction and the second direction may be substantially perpendicular to each other, and the emit elements may have a substantially rectangular shape, and may respectively have short sides in the first direction and long sides, which are longer than the short sides, in the second direction.

One of the long sides of the first emit element and one of the long sides of the second emit element may be close to each other.

In another exemplary embodiment of the present invention, a display device includes a plurality of scan lines provided in a first direction for transmitting select signals, a plurality of data lines provided in a second direction substantially perpendicular to the first direction for transmitting data signals, and a plurality of pixel circuits respectively coupled to the scan lines and the data lines. At least one of the pixel circuits includes a first capacitor, a first transistor, a first emit element, a second emit element, a third emit element, a first emit control transistor, a second emit control transistor, and a third emit control transistor. The first capacitor has a first electrode coupled to a power source and charges a voltage corresponding to one of the data signals transmitted by a corresponding one of the data lines, the first transistor outputs a current corresponding to the voltage charged in the first capacitor, the first, second, and third emit elements output light corresponding to the current output by the first transistor, and the first, second, and third emit control transistors selectively apply the current output by the first transistor to the first, second and third emit elements. The first capacitor is disposed in an area between the first and second emit elements or in an area between the second and third emit elements. The scan lines and the data lines may insulatively cross over each other.

The emit elements may have a substantially rectangular shape, and may respectively have short sides in the first direction and long sides, which are longer than the short sides, in the second direction. At least one of the long sides of each of the first, second and third emit elements are provided closely to one of the long sides of another one of the first, second and third emit elements.

The at least one of the pixel circuits may further include: a second capacitor, a second transistor, and a third transistor. The second capacitor may have a first electrode coupled to a second electrode of the first capacitor, and a second electrode thereof coupled to a control electrode of the first transistor, and may charge a voltage corresponding to a threshold voltage of the first transistor. The second transistor may diode-connect the first transistor, and the third transistor may be coupled in parallel with the first capacitor.

In yet another exemplary embodiment of the present invention, a display panel includes a first scan line and a second scan line, a first data line and a second data line, and a first emit element and a second emit element. The first and second scan lines are provided in a first direction, are adjacent to each other, and respectively transmit a first select signal and a second select signal. The first and second data lines are provided in a second direction, are adjacent to each other, and respectively transmit a first data signal and a second data signal. The first and second emit elements each have a substantially rectangular shape, and are disposed in an area defined by the first and second scan lines and the first and second data lines.

In still another exemplary embodiment of the present invention, a display panel includes a first scan line and a second scan line, a first data line and a second data line, and a first emit element, a second emit element, and a third emit element. The first and second scan lines are provided in a first direction, are adjacent to each other, and respectively transmit a first select signal and a second select signal, the first and second data lines are provided in a second direction, are adjacent to each other, and respectively transmit a first data signal and a second data signal. The first, second, and third emit elements each have a substantially rectangular shape, and are disposed in an area defined by the first and second scan lines and the first and second data lines.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
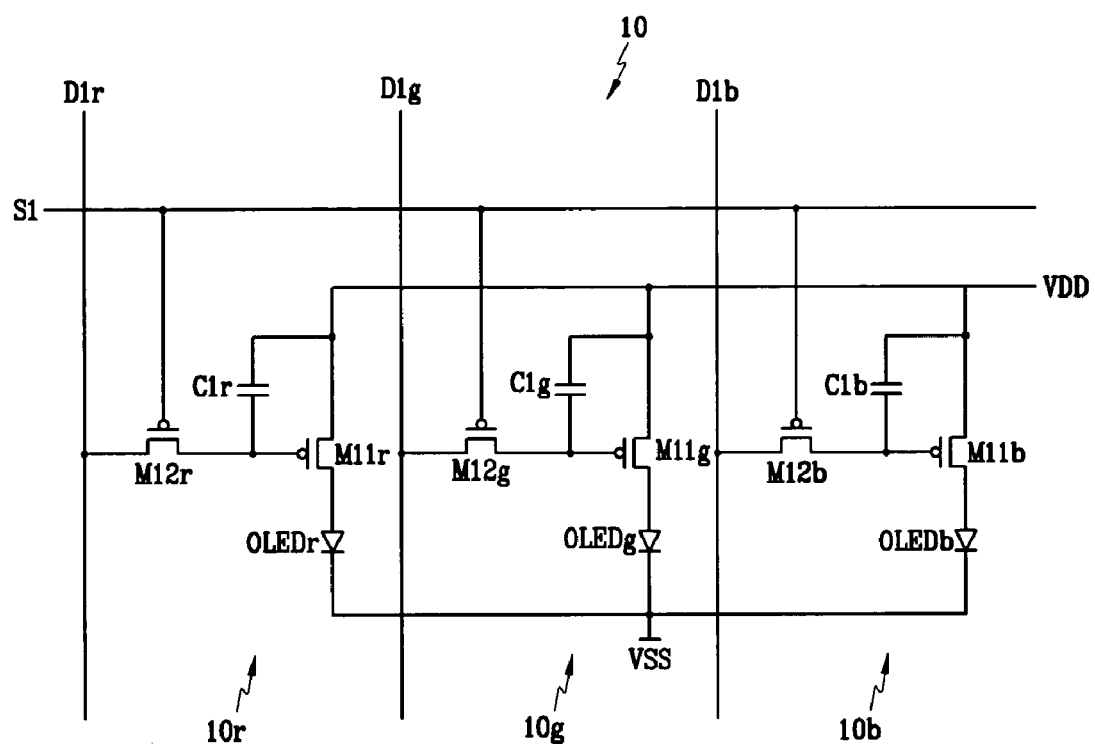
FIG. 1 shows a conventional pixel circuit of a light emitting display panel.

In the following detailed description, only certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, rather than restrictive.

There may be parts shown in the drawings, or parts not shown in the drawings, that are not discussed in the specification as they are not essential to a complete understanding of the invention. Like reference numerals designate like elements.

As to jargon on the scan lines, a scan line for transmitting a current select signal will be referred to as a "current scan line," a scan line which has transmitted a select signal before the current select signal is transmitted will be referred to as a "previous scan line," and a scan line which will transmit a select signal after the current select signal is transmitted will be referred to as a "subsequent scan line."

In addition, a pixel which emits light based on the select signal of the current scan line will be referred to as a "current pixel," a pixel which emits light based on the select signal of the previous scan line will be referred to as a "previous pixel,"

and a pixel which emits light based on the select signal of the subsequent scan line will be referred to as a "subsequent pixel."

Exemplary embodiments of the present invention will now be described in detail with reference to the drawings.

Figure 2:
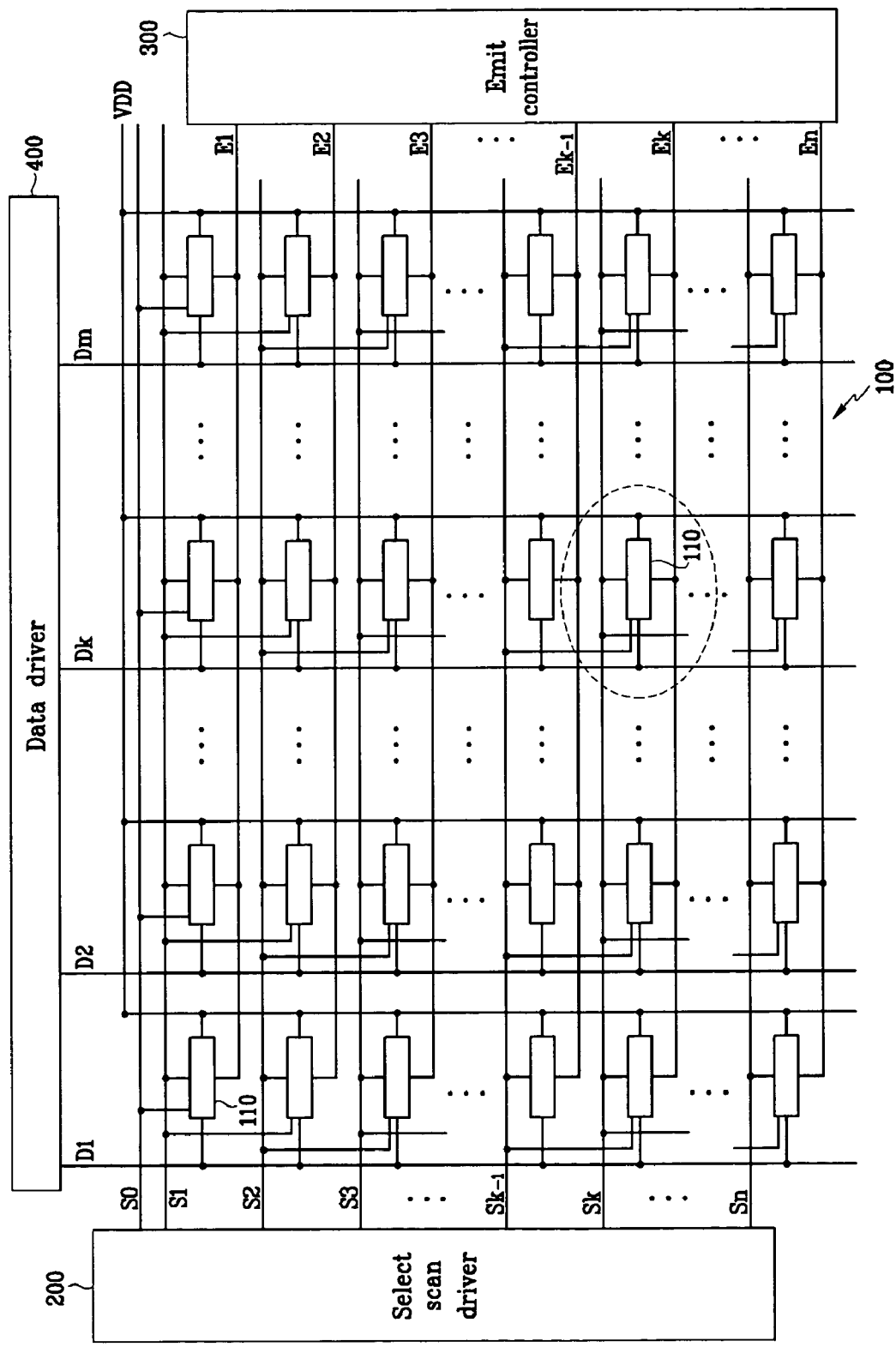
FIG. 2 shows a schematic diagram for an organic EL display according to an exemplary embodiment of the present invention.

FIG. 2 shows a configuration of an organic EL display according to an exemplary embodiment of the present invention.

As shown, the organic EL display includes a display panel 100, a scan driver 200, an emit controller 300, and a data driver 400. The display panel 100 includes a plurality of scan lines S0, S1, . . . , Sk, . . . , Sn and emit control lines E1, . . . , Ek, . . . , En provided in the row direction, a plurality of data lines D1, . . . , Dk, . . . , Dm provided in the column direction, a plurality of power lines for transmitting power supply voltages VDD, and a plurality of pixels 110. A pixel 110 is formed at a pixel area defined or surrounded by two scan lines Sk-1 and Sk and two adjacent data lines Dk-1 and Dk, and is driven by signals transmitted by the current scan line Sk, the previous scan line Sk-1, the emit control line Ek, and the data line Dk. The emit control lines E1 to En respectively include three emit control lines for emitting red, green, and blue (RGB) colors (e.g., E1 includes E1r, E1g, and E1b and En includes Enr, Eng, and Enb).

Figure 3:
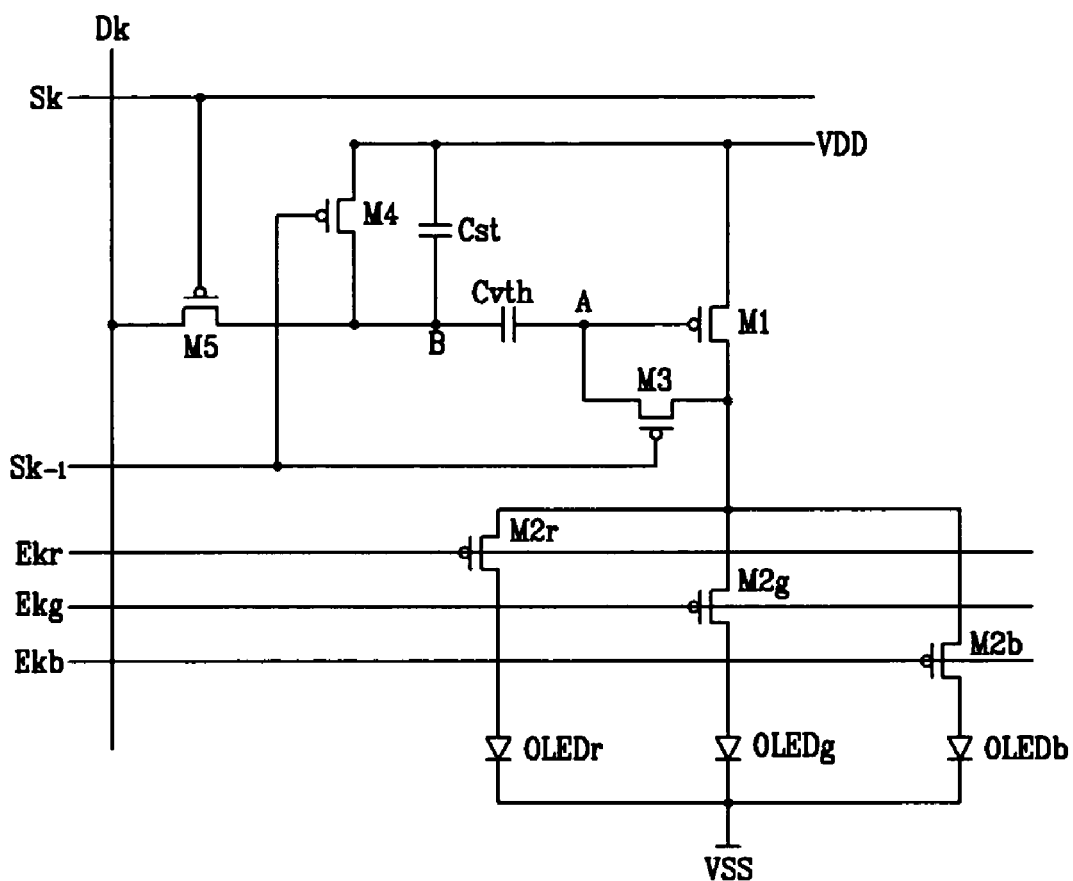
FIG. 3 shows an equivalent circuit diagram of a pixel circuit 110 according to an exemplary embodiment of the present invention.

The scan driver 200 sequentially transmits select signals for selecting lines to the scan lines S0 to Sn so that data signals may be applied to pixels of the corresponding selected scan lines, the emit controller 300 sequentially transmits emit control signals for controlling emission of the organic EL elements OLEDr, OLEDg, and OLEDb shown in FIG. 3 to the emit control lines E1 to En, and the data driver 400 applies data signals, which correspond to the pixels of the selected scan lines to which the select signals are applied, to the data lines D1 to Dm when the select signals are sequentially applied.

The scan driver 200, the emit controller 300, and the data driver 400 can be coupled to a substrate on which the display panel 100 is provided. Alternatively, the scan driver 200, the emit controller 300, and/or the data driver 400 can be directly installed on a glass substrate of the display panel 100, or can be replaced with a driving circuit formed on the same layer as that of the scan lines, the data lines, and the transistors on the substrate of the display panel 100. Further, the scan driver 200, the emit controller 300, and/or the data driver 400 can be mounted in a chip format on a tape carrier package (TCP) or a flexible printed circuit (FPC) coupled to the substrate of the display panel 100.

In addition, a field can be divided into three subfields which are then driven, and the three subfields program red, green, and blue data and emit light. To achieve this purpose, the scan driver 200 sequentially transmits a select signal to the scan lines S0 to Sn for each subfield, the emit controller 300 applies an emit control signal to the emit control lines E1 to En so that the organic EL elements of respective colors may emit light in a subfield, and the data driver 400 applies data signals corresponding to the red, green, and blue organic EL elements to the data lines D1 to Dm in the three subfields.

An operation of the organic EL display according to the exemplary embodiment of the present invention will be described in detail with reference to FIG. 3.

FIG. 3 shows an equivalent circuit diagram of the pixel 110 in the organic EL display shown in FIG. 2. For ease of description, the pixel Pk coupled to the scan line Sk of the k-th row and the data line Dk of the k-th column is exemplarily illustrated, and p-channel transistors are shown by way of example in FIG. 3.

As shown in FIG. 3, the pixel circuit includes a driving transistor M1, a diode transistor M3, a capacitor transistor M4, a switching transistor M5, organic EL elements OLEDr, OLEDg, and OLEDb, emit control transistors M2r, M2g, and M2b for controlling emission of the organic EL elements OLEDr, OLEDg, and OLEDb, and capacitors Cst and Cvth. One emit control line Ek shown in FIG. 2 includes emit control lines Ekr, Ekg, and Ekb. The emit control transistors M2r, M2g, and M2b respond to emit control signals transmitted by the emit control lines Ekr, Ekg, and Ekb, and selectively transmit the current provided by the driving transistor M1 to the organic EL elements OLEDr, OLEDg, and OLEDb.

In detail, the transistor M5 has a gate coupled to the current scan line Sk and a source coupled to the data line Dk, and the transistor M5 responds to the select signal provided by the scan line Sk and transmits the data voltage provided by the data line Dk to a node B of the capacitor Cvth. The transistor M4 responds to the select signal provided by the previous scan line Sk-1 and couples the node B of the capacitor Cvth to the power supply voltage VDD. The transistor M3 is coupled to a node A of the capacitor Cvth and is also coupled to the organic EL elements OLEDr, OLEDg, and OLEDb through the transistors M2r, M2g, and M2b respectively. The transistor M3 responds to the select signal provided by the previous scan line Sk-1 and diode-connects the transistor M1. The driving transistor M1 for driving the organic EL element OLED has a gate coupled to the node A of the capacitor Cvth and a source coupled to the power supply voltage VDD, and controls the current to be applied to the organic EL element OLED (e.g., OLEDr, OLEDg, and/or OLEDb) according to the voltage applied to the gate.

Also, the capacitor Cst has a first electrode coupled to the power supply voltage VDD and a second electrode coupled to a drain electrode of the transistor M4 (e.g., at around the node B), and a first electrode or Node B of the capacitor Cvth is coupled to the second electrode of the capacitor Cst to thus couple the two capacitors in series, and a second electrode or node A of the capacitor Cvth is coupled to the gate electrode of the driving transistor M1 (e.g., at around the node A).

The drain of the driving transistor M1 is coupled to sources of the emit control transistors M2r, M2g, and M2b which have gates respectively coupled to the emit control lines Ekr, Ekg, and Ekb. The emit control transistors M2r, M2g, and M2b have drains respectively coupled to anodes of the organic EL elements OLEDr, OLEDg, and OLEDb which have cathodes to which the power supply voltage VSS less than the power supply voltage VDD is applied. A negative voltage or a ground voltage can be used for the power supply voltage VSS.

In operation, when a low-level scan voltage is applied to the previous scan line Sk-1, the transistors M3 and M4 are turned on. When the transistor M3 is turned on, the transistor M1 is diode-connected. Therefore, a voltage difference between the gate and the source of the transistor M1 is varied until the voltage difference reaches a threshold voltage (Vth) of the transistor M1. Since the source of the transistor M1 is coupled to the power supply voltage VDD in this instance, the voltage applied to the gate of the transistor M1, that is, the node A of the capacitor Cvth, becomes a sum of the power supply voltage VDD and the threshold voltage (Vth). Further, the transistor M4 is turned on to apply the power VDD to the node B of the capacitor Cvth. As such, a voltage (Vcvth) charged in the capacitor Cvth is given in Equation 2.

$$V_{Cvth} = V_{CvthA} - V_{CvthB} = (VDD + V_{th}) - VDD = V_{th} \qquad \text{Equation 2}$$

where $V_{Cvth}$ is a voltage charged in the capacitor Cvth, $V_{cVthA}$ is a voltage applied to the node A of the capacitor Cvth, and $V_{CvthB}$ is a voltage applied to the node B of the capacitor Cvth.

When a low-level scan voltage is applied to the current scan line Sk, the transistor M5 is turned on to apply the data voltage (Vdata) to the node B. Also, since the capacitor Cvth is charged with the voltage corresponding to the threshold voltage (Vth) at the transistor M1, the voltage corresponding to the sum of the data voltage (Vdata) and the threshold voltage (Vth) at the transistor M1 is applied to the gate of the transistor M1. That is, a voltage (Vgs) between the gate and the source of the transistor M1 is given in Equation 3. In this instance, a high-level signal is applied to the emit control line Ek (e.g., Ekr, Ekg, and/or Ekb), and the transistor M2 (e.g., M2r, M2g, and/or M2b) is turned off to block a current flow.

$$V_{gs}=(V_{data}+V_{th})-VDD \quad \text{Equation 3}$$

Next, the transistor M2 is turned on in response to a low level of the emit control line Ek, the current ($I_{OLED}$) corresponding to the gate-source voltage of Vgs at the transistor M1 is supplied to the organic EL element OLED through the transistor M2, and the organic EL element OLED (e.g., OLEDr, OLEDg, and/or OLEDb) emits light. The current ($I_{OLED}$) is given in Equation 4.

$$\begin{aligned}I_{OLED} &= \frac{\beta}{2}(V_{gs}-V_{th})^2 \quad \text{Equation 4}\\ &= \frac{\beta}{2}((V_{data}+V_{th}-VDD)-V_{th})^2 \\ &= \frac{\beta}{2}(VDD-V_{data})^2\end{aligned}$$

where $I_{OLED}$ is a current flowing to the organic EL element, $V_{gs}$ is a voltage between the source and the gate of the transistor M1, $V_{th}$ is a threshold voltage of the transistor M1, $V_{data}$ is a data voltage, and β is a constant.

In more detail, when the emit control transistor M2r is turned on in response to the low-level emit control signal provided by the emit control line Ekr, in the case that the data voltage (Vdata) represents a red data signal, the current ($I_{OLED}$) is transmitted to the red organic EL element OLEDr, which then emits light.

Likewise, when the emit control transistor M2g is turned on in response to the low-level emit control signal provided by the emit control line Ekg, in the case that the data voltage (Vdata) represents a green data signal, the current ($I_{OLED}$) is transmitted to the green organic EL element OLEDg, which then emits light. Also, when the emit control transistor M2b is turned on in response to the low-level emit control signal provided by the emit control line Ekb, in the case that the data voltage (Vdata) represents a blue data signal, the current ($I_{OLED}$) is transmitted to the blue organic EL element OLEDb, which then emits light. The three light control signals applied to the three emit control lines Ekr, Ekg, and Ekb respectively have a low-level period which is not superimposed on one another so that one pixel may represent red, green, and blue.

Figure 4:
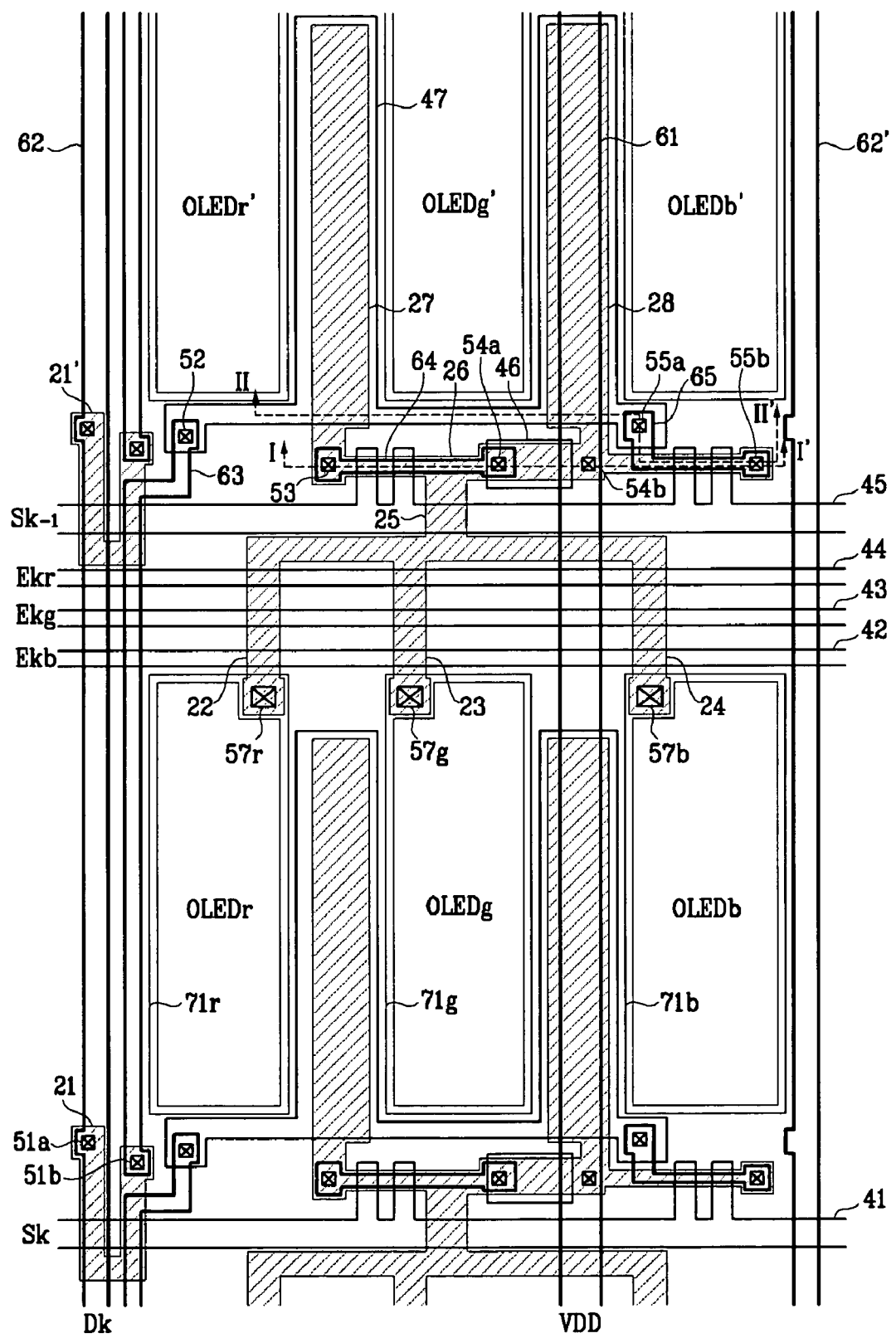
FIG. 4 shows an arrangement diagram for the pixel circuit according to an exemplary embodiment of the present invention.
Figure 5:
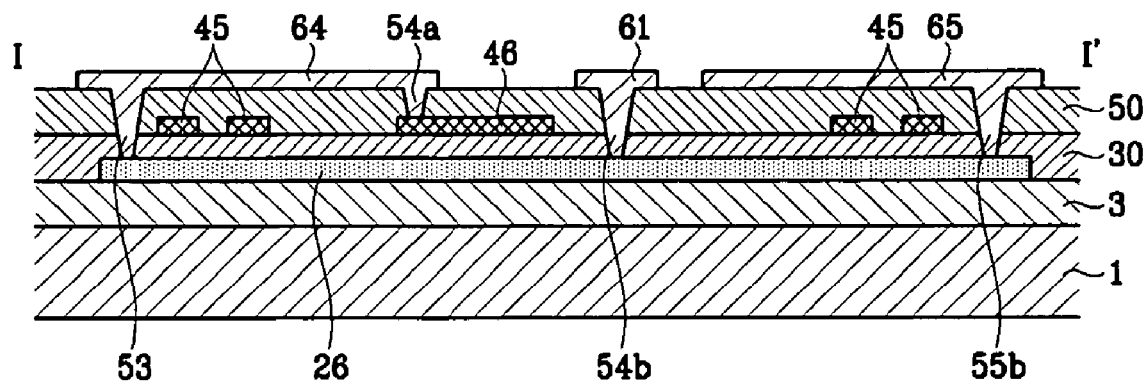
FIG. 5 shows a cross-sectional view with respect to the part of I to I' in FIG. 4.
Figure 6:
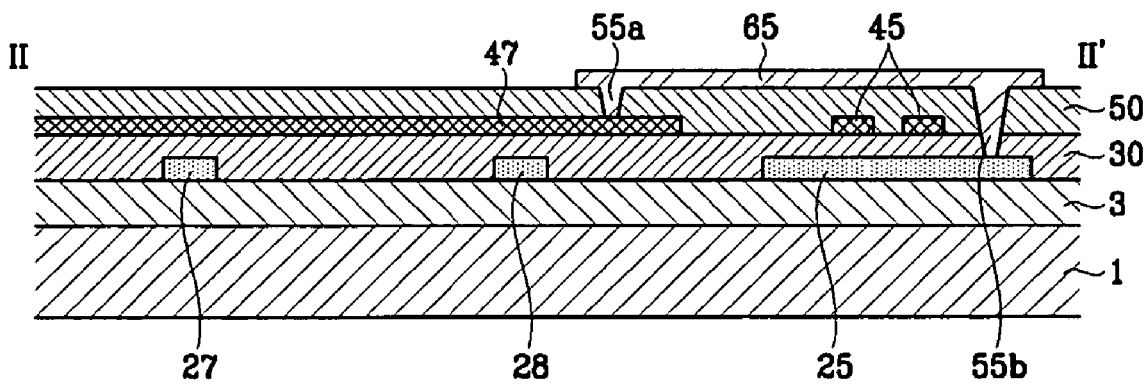
FIG. 6 shows a cross-sectional view with respect to the part of II to II' in FIG. 4.

Referring to FIGS. 4 to 6, an arrangement structure of a pixel area in which a pixel circuit is provided in the organic EL display according to the exemplary embodiment of the present invention will be described. Herein, certain components of the current pixel Pk will have normal reference numerals, and certain components of the previous pixel Pk-1 will have apostrophe-added ("'") reference numerals to thus distinguish the certain components of the current pixel from the certain components of the previous pixel.

FIG. 4 shows an exemplified arrangement diagram for a pixel area in which the pixel circuit shown in FIG. 3 is arranged according to an exemplary embodiment of the present invention, FIG. 5 shows a cross-sectional view with respect to the part of I to I' in FIG. 4, and FIG. 6 shows a cross-sectional view with respect to the part of II to II' in FIG. 4.

As shown by FIGS. 4 to 6, a shield layer 3 of silicon oxide is formed on an insulation substrate 1, and polysilicon layers 21, 22, 23, 24, 25, 26, 27, and 28, which are semiconductor layers, are formed on the shield layer 3.

The U-shaped polysilicon layer 21 forms a semiconductor layer including a source region, a drain region, and a channel region of the transistor M5 of the current pixel Pk. The polysilicon layers 22, 23, 24, 25, 26, 27, and 28 are formed in a body or as a single unit. The polysilicon layer 27 is extended in the column direction between the emit elements OLEDr' and OLEDg' of the previous pixel Pk-1 to form the node A, which is an electrode or a first electrode of the capacitor Cvth. The polysilicon layer 28 is extended in a column direction between the emit elements OLEDg' and OLEDb' of the previous pixel Pk-1 to form an electrode of the capacitor Cst. The polysilicon layer 26 is adjacent to the emit elements OLEDg' and OLEDb' and is extended in a row direction with the horizontal width of the emit elements OLEDg' and OLEDb' to form a semiconductor layer of the transistors M1, M3, and M4. The polysilicon layer 25 is coupled to the polysilicon layer 26 on about the center of the row-directional width of a pixel area, that is, on about the center of the horizontal width of the emit elements OLEDr', OLEDg', and OLEDb'. The polysilicon layer 25 is formed in the column direction, and forms a drain region of the transistor M1 and source regions of the transistors M2r, M2g, and M2b. The polysilicon layers 22, 23, and 24 are branched out from the polysilicon layer 25 to form an 'm' pattern and form drain regions of the transistors M2r, M2g, and M2b.

A gate insulation film 30 is formed on the above-formed polysilicon layers 21, 22, 23, 24, 25, 26, 27, and 28.

Gate electrode lines 41, 42, 43, 44, 45, 46, and 47 are formed on the gate insulation film 30. In more detail, since the gate electrode line 41 is extended in the row direction and corresponds to the current scan line Sk of the current pixel Pk, the gate electrode line 41 insulatively crosses the polysilicon layer 21 and forms a gate electrode of the transistor M5 of the current pixel Pk. Since the gate electrode line 42 is extended in the row direction and corresponds to the emit control line Ekb of the current pixel Pk, the gate electrode line 42 forms a gate electrode of the transistor M2b. Since the gate electrode line 43 is extended in the row direction and corresponds to the emit control line Ekg of the current pixel Pk, the gate electrode line 43 forms a gate electrode of the transistor M2g. Since the gate electrode line 44 is extended in the row direction and corresponds to the emit control line Ekr of the current pixel Pk, the gate electrode line 44 forms a gate electrode of the transistor M2k. Since the gate electrode line 45 is extended in the row direction and corresponds to the previous scan line Sk-1 of the previous pixel Pk-1, the gate electrode line 45 insulatively crosses the polysilicon layer 21' and forms a gate electrode of the transistor M5 of the previous pixel Pk-1. Also, the gate electrode line 45 insulatively crosses the polysilicon layer 25 and forms gate electrodes of the transistors M3 and M4 of the current pixel Pk. The gate electrode 46 insulatively crosses the polysilicon layer 26 in a rectangular manner on the bottom of the emit element OLEDg' to form a gate electrode of the transistor M1. The gate electrode 47 is formed in a U shape and is provided between the emit elements OLEDr' and the OLEDg' and between the emit elements OLEDg' and the OLEDb', and forms a node B on which the capacitors Cvth and Cst are coupled in series. Therefore, as shown in FIG. 6, a portion of the gate electrode 47 is superimposed on the polysilicon layer 27 to become an electrode of the capacitor Cvth, and another portion of the gate electrode 47 is superimposed on the polysilicon layer 28 to become an electrode of the capacitor Cst.

Referring now back to FIGS. 4 to 6, an inter-layer insulation film 50 is formed on the gate electrodes 41, 42, 43, 44, 45, 46, and 47. A power line 61, a data line 62, and electrodes 63, 64, 65, 71r, 71g, and 71b are formed on the inter-layer insulation film 50 and are coupled to the corresponding electrodes through contact holes 51a, 51b, 52, 53, 54a, 55a, 55b, 57r, 57g, and 57b.

The power line 61 is extended in the column direction between the emit elements OLEDg and OLEDb, and is coupled to the polysilicon layers 28 and 26 through a contact hole 54b, which penetrates the inter-layer insulation film 50 and the gate insulation film 30, to supply power to the first electrode of the capacitor Cst and the source of the transistor M1.

The data line 62 is extended in the column direction between a pixel area and another pixel area, and is coupled to the polysilicon layer 21 through a contact hole 51a which penetrates the inter-layer insulation film 50 and the gate insulation film 30, and is coupled to the source of the transistor M4.

The electrode 63 couples the polysilicon layer 21 and the gate electrode 47 through the contact hole 51b, which penetrates the inter-layer insulation film 50 and the gate insulation film 30, and a contact hole 52, which penetrates the inter-layer insulation film 50, and becomes the node B.

The electrode 64 couples the drain of the transistor M3 of the polysilicon layer 26 and the gate electrode 46 through the contact hole 53, which penetrates the inter-layer insulation film 50 and the gate insulation film 30, and the contact hole 54a, which penetrates the inter-layer insulation film 50, and becomes the node A.

The electrode 65 couples the drain of the transistor M4 of the polysilicon layer 25 and the gate electrode 47 through the contact hole 55a, which penetrates the inter-layer insulation film 50, and the contact hole 55b, which penetrates the inter-layer insulation film 50 and the gate insulation film 30, and becomes the node B.

The electrodes 71r, 71g, and 71b are pixel electrodes of the respective emit elements. The pixel electrodes 71r, 71g, and 71b are respectively coupled to the polysilicon layers 22, 23, and 24 through the contact holes 57r, 57g, and 57b, which penetrate the gate insulation film 30 and the inter-layer insulation film 50, and are then coupled respectively to the drain electrodes of the transistors M2r, M2g, and M2b.

The pixel electrodes 71r, 71g, and 71b of emit elements OLEDr, OLEDg, and OLEDb are formed to have a substantially rectangular shape in which the vertical line or side of the rectangle parallel to the data line 62 is longer than the horizontal line or side of the rectangle parallel to the gate electrodes 42 to 44, and hence, the longer vertical lines of the emit elements OLEDr, OLEDg, and OLEDb are arranged near each other.

As described above, the three organic EL elements OLEDr, OLEDg, and OLEDb are arranged in a pixel area between two adjacent data lines 62 and 62'. Further, the capacitor Cvth of FIG. 3 has a first electrode being the polysilicon layer 27 and a second electrode being the gate electrode 47, and is formed between the organic EL elements OLEDr and OLEDg. The capacitor Cst of FIG. 3 has a first electrode being the gate electrode 47 and the second electrode being the polysilicon layer 28 coupled to the power line 61, and is formed between the organic EL elements OLEDg and OLEDb.

Hence, a sufficient area for arranging the capacitors can be occupied without reducing the aperture ratios of the pixels by arranging the capacitor between the emit elements.

The described exemplary embodiment describes the pixel circuit which includes five transistors, two capacitors, and three emit elements. However, the number of emit elements are not restricted to three. By way of example, the principles of the present invention are also applicable to the pixel circuit with two transistors and one capacitor shown in FIG. 1.

The light emitting display according to the described exemplary embodiments of the present invention has a structure in which a plurality of emit elements are included in a pixel area provided between adjacent data lines and at least one capacitor is installed between two emit elements.

Therefore, the respective elements which configure the pixels in the pixel area are more efficiently arranged by arranging a plurality of emit elements between the adjacent data lines and arranging the capacitor between the emit elements, since a sufficient area required for the capacitors can be occupied without decreasing the aperture ratio of the pixels or not decreasing the aperture ratio as much as in a conventional pixel circuit.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. A display device including a plurality of scan lines provided in a first direction for transmitting select signals, a plurality of data lines provided in a second direction for transmitting data signals, and a plurality of pixel circuits respectively coupled to the scan lines and the data lines, wherein at least one of the pixel circuits comprises:
 a capacitor for charging a voltage corresponding to one of the data signals transmitted by a corresponding one of the data lines;
 a first transistor for outputting a current corresponding to the voltage charged in the capacitor;
 a first emit element and a second emit element for outputting light corresponding to the current output by the first transistor; and
 a first emit control transistor and a second emit control transistor for selectively applying the current output by the first transistor to the first and second emit elements,
 wherein the capacitor is disposed in an area between the first and second emit elements.

2. The display device of claim 1, wherein the first direction and the second direction are substantially perpendicular to each other, and
 wherein the emit elements have a substantially rectangular shape, and respectively have short sides in the first direction and long sides, which are longer than the short sides, in the second direction.

3. The display device of claim 2, wherein one of the long sides of the first emit element and one of the long sides of the second emit element are close to each other.

4. A display device including a plurality of scan lines provided in a first direction for transmitting select signals, a plurality of data lines provided in a second direction substantially perpendicular to the first direction for transmitting data signals, and a plurality of pixel circuits respectively coupled to the scan lines and the data lines, wherein at least one of the pixel circuits comprises:

a first capacitor having a first electrode coupled to a power source and for charging a voltage corresponding to one of the data signals transmitted by a corresponding one of the data lines;

a first transistor for outputting a current corresponding to the voltage charged in the first capacitor;

a first emit element, a second emit element, and a third emit element for outputting light corresponding to the current output by the first transistor; and a first emit control transistor, a second emit control transistor, and a third emit control transistor for selectively applying the current output by the first transistor to the first, second and third emit elements, wherein the first capacitor is disposed in an area between the first and second emit elements or in an area between the second and third emit elements.

5. The display device of claim 4, wherein the emit elements have a substantially rectangular shape, and respectively have short sides in the first direction and long sides, which are longer than the short sides, in the second direction, and wherein at least one of the long sides of each of the first, second and third emit elements are provided closely to one of the long sides of another one of the first, second and third emit elements.

6. The display device of claim 5, wherein the at least one of the pixel circuits further comprises:

a second capacitor having a first electrode coupled to a second electrode of the first capacitor, and a second electrode thereof coupled to a control electrode of the first transistor, the second capacitor for charging a voltage corresponding to a threshold voltage of the first transistor;

a second transistor for diode-connecting the first transistor; and a third transistor coupled in parallel with the first capacitor.

7. The display device of claim 6, wherein the first capacitor is disposed in an area between the first and second emit elements, and the second capacitor is disposed in an area between the second and third emit elements.

8. A display panel comprising:

a first scan line and a second scan line provided in a first direction, are adjacent to each other, and respectively transmit a first select signal and a second select signal;

a first data line and a second data line provided in a second direction, are adjacent to each other, and respectively transmit a first data signal and a second data signal; and a first emit element and a second emit element, each having a substantially rectangular shape, and disposed in an area defined by the first and second scan lines and the first and second data lines.

9. The display panel of claim 8, wherein the first and second emit elements are operable based on the first select signal and the first data signal.

10. The display panel of claim 9, wherein a capacitor for charging a voltage corresponding to the data signal is disposed in an area between the first and second emit elements.

11. The display panel of claim 10, wherein the first and second emit elements have short sides in the first direction and long sides in the second direction, the long sides being longer than the short sides.

12. The display panel of claim 8, further comprising a third emit element having a substantially rectangular shape and disposed in the area defined by the first and second scan lines and the first and second data lines.

13. The display panel of claim 12, wherein a capacitor for charging a voltage corresponding to the data signal is disposed in an area between the first and second emit elements or disposed in an area between the second and third emit elements.

14. A display panel including, in an array format, a plurality of scan lines provided in a first direction for transmitting select signals, a plurality of data lines provided in a second direction for transmitting data signals, and a plurality of pixel circuits respectively coupled to the scan lines and the data lines, wherein at least one of the pixel circuits comprises:

a first emit element and a second emit element, each having a substantially rectangular shape, and having short sides in the first direction and long sides in the second direction, the long sides being longer than the short sides, and one of the long sides of the first emit element and one of the long sides of the second emit element being adjacent and substantially parallel to each other; and a capacitor provided in the second direction between the first and second emit elements.

15. The display panel of claim 14, further comprising a third emit element having a substantially rectangular shape and having short sides in the first direction and long sides in the second direction, the long sides being longer than the short sides; and a second capacitor provided in the second direction between the second and third emit elements, wherein one of the long sides of the third emit element is adjacent to one of the long sides of the second element and the long sides of the third emit element are substantially parallel to the long sides of the first and second elements.

16. The display panel of claim 15, wherein a first electrode of the first capacitor and a first electrode of the second capacitor are coupled to each other, and wherein the first electrodes of the first and second capacitors are formed to surround at least a part of the second emit element.

17. The display panel of claim 15, wherein the first electrodes of the first and second capacitors are provided to be a U pattern for coupling two long sides and one of the short sides of the second emit element.

* * * * *